US006475813B1

(12) United States Patent
Li et al.

(10) Patent No.: US 6,475,813 B1
(45) Date of Patent: *Nov. 5, 2002

(54) MOCVD AND ANNEALING PROCESSES FOR C-AXIS ORIENTED FERROELECTRIC THIN FILMS

(75) Inventors: Tingkai Li, Vancouver, WA (US); Wei Pan, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/929,711

(22) Filed: Aug. 13, 2001

(51) Int. Cl.$^7$ ................................................ A01L 21/00
(52) U.S. Cl. .......................... 438/3; 438/240; 438/250; 438/253; 438/393; 438/396; 257/295
(58) Field of Search ........................... 438/3, 240, 250, 438/253, 393, 396; 257/295

(56) References Cited

U.S. PATENT DOCUMENTS

| | | | | |
|---|---|---|---|---|
| 3,717,562 A | * | 2/1973 | Schinke et al. | 204/180 R |
| 5,111,186 A | * | 5/1992 | Narlow et al. | 340/572.5 |
| 5,257,009 A | * | 10/1993 | Norlow | 340/572.3 |
| 6,110,531 A | * | 8/2000 | Paz de Araujo et al. | 427/255.19 |
| 6,190,925 B1 | * | 2/2001 | Li et al. | 438/3 |
| 6,229,166 B1 | * | 5/2001 | Kim et al. | 257/295 |
| 6,281,022 B1 | * | 8/2001 | Li et al. | 438/3 |

OTHER PUBLICATIONS

Zhang et al. "Phase and Microstructure Analysis of Lead Germanate Thin Film Deposited by Metalorganic Chemical Vapor Depostion" Jpn. J. Appl. Phys. vol. 23., Jan. 1999, pp L59–L61.*
United States Patent Application Publication US 2001/0024835 A1 (ser. No. 09/814723) Li et al. Sep. 27, 2001.*
Article entitled, "Processing of a Uniaxial Ferroelectric $Pb_5Ge_3O_{11}$ Thin Film at 450°C with C–Axis Orientation", by J.J. Lee and S.K. Dey, published in Appl. Phys. Lett. 60 (2), May 18, 1992, pp. 2487–2488.
Article entitled, "Ferroelectric and Optical Properties of $Pb_5Ge_3O_{11}$ and its Isomorphous Compound $Pb_5Ge_3SiO_{11}$", by H. Iwasaki, S. Miyazawa, H. Koizumi, K. Sugii & N. Niizeki, published in J. Appl. .Phys., vol. 43, No. 12, Dec. 1972, pp. 4907–4915.

Article entitled, Electro–optic Properties of Ferroelectric $5PbO–3GeO_2$ Single Crystal, by N. Uchida, T. Saku, H. Iwasaki & K. Onuki, published in J. Appl. Phys., vol. 43, No. 12, Dec. 1972, pp. 4933–4936.
Article entitled, "Oriented Lead Germanate Thin Films by Excimer Laser Ablation", by C.J. Peng, D. Roy and S.B. Krupanidhi, published in Appl. Phys. Lett. 60 (7), Feb. 17, 1992, pp. 827–829.
Article entitled, Evolution of Ferroelectricity in Ultrafine–grained $Pb_5Ge_3O_{11}$ Crystallized from the Glass, by A.M. Glass, K. Nassau & J.W. Shiever, published in J. Appl. Phys. 48(12) Dec. 1977, pp. 5213–5216.
Article entitled, $5PbO–3GeO_2$ Crystal; A New Ferroelectric, by H. Iwasaki, K. Sugii, T. Yamada & N. Niizeki, published in Appl. Phys., vol. 18, No.;. 10, May 15, 1971, pp. 444–445.
Article entitled, Elastic and Piezoelectric Properties of Ferroelectric $5PbO—3GeO_2$ Crystals, by T. Yamada, H. Iwasaki & N. Niizeki, published in J. Appl. Phys. vol. 43, No. 3, Mar., 1972, pp. 771–775.
Article entitled, Electrical and Structural Properties of Flash–Evaporated Ferroelectric Lead Germanate Films on Silicon, by A. Mansingh & S.B. Krupanidni, published in Thin Solid Films,80(1981) pp. 359–371.
Article entitled Preparation and Properties of Thermally Evaporated Lead Germanate Films, by A. Mansingh & S.B. Krupanidhi, published in J. Appl. Phys. 51(10), Oct. 1980, pp. 5408–5412.
Zwicker et al., "Formation of secondary Phase during Crystal Growth of Pb5Ge3011," J. of Electr. Mater., 6(2), p125.*
Haegawa et al., "Phase Relations and Crystallization of Glass in the System PbO–GeO2," J. of Mater. Science, 8 (12), p. 1725–1730.*

* cited by examiner

Primary Examiner—John F. Niebling
Assistant Examiner—Jennifer M. Kennedy
(74) Attorney, Agent, or Firm—David C. Ripma; Matthew D. Rabdau; Scott C. Krieger

(57) ABSTRACT

A method of fabricating a c-axis ferroelectric thin film includes preparing a substrate; depositing a layer of ferroelectric material by metal organic chemical vapor deposition, including using a precursor solution having a ferroelectric material concentration of about 0.1 M/L at a vaporizer temperature of between about 140° C. to 200° C.; and annealing the substrate and the ferroelectric material at a temperature between about 500° C. to 560° C. for between about 30 minutes to 120 minutes.

22 Claims, 3 Drawing Sheets

MOCVD AND ANNEALING PROCESSES FOR C-AXIS ORIENTED FERROELECTRIC THIN FILMS

FIELD OF THE INVENTION

This invention relates to the fabrication of ferroelectric memory devices, and more particularly to the use of specifically oriented ferroelectric thin films which exhibit both very good ferroelectric properties and lower surface roughness.

BACKGROUND OF THE INVENTION

The use of ferroelectric thin films in non-volatile memories has drawn much attention in recent years, primarily due to the bi-stable nature of these films, i.e., these films have two predominant polarization directions. Most of the studies of Ferroelectric Random Access Memories (FRAMs) have concentrated on structures having one transistor and one capacitor. The capacitor is made of a thin ferroelectric film sandwiched between two conductive electrodes. The circuit configuration and read/write sequence of this type memory are similar to that of DRAMs, except that data refreshing is not necessary in FRAMs.

Another aspect of ferroelectric non-volatile memory formation is to determine the best technique for deposition of a ferroelectric thin film directly onto the gate area of a FET and to form a ferroelectric-gate controlled FET (FGCFET). Ferroelectric-gate-controlled devices, such as metal-ferroelectric-silicon (MFS) FETs, have been proposed as early as the 1950s, and various modified MFSFET structures have been proposed, for example, metal-ferroelectric-insulator-silicon (MFIS) FETs, metal-ferroelectric-metal-silicon (MFMS) FETs, and metal-ferroelectric-metal-oxide-silicon (MFMOS) FETs.

In order to meet the requirements of FRAMs applications, however, specifically oriented ferroelectric thin films are needed. Experimental results demonstrate that, using metal organic chemical vapor deposition (MOCVD) processes, high oriented, i.e., wherein the ration of c-axis peak-to-random peak is larger than 80%, ferroelectric thin films always have an unacceptable surface roughness because of the growth process using MOCVD.

SUMMARY OF THE INVENTION

A method of fabricating a c-axis ferroelectric thin film includes preparing a substrate; depositing a layer of ferroelectric material by metal organic chemical vapor deposition, including using a precursor solution having a ferroelectric material concentration of about 0.1 M/L at a vaporizer temperature of between about 140° C. to 200° C.; and annealing the substrate and the ferroelectric material at a temperature between about 500° C. to 560° C. for between about 30 minutes to 120 minutes.

An object of the invention is to provide fabrication processes, such as MOCVD and annealing, for ferroelectric thin films having a preferred orientation.

Another object of the invention is to provide a ferroelectric thin film having minimal surface roughness, uniform surface morphology and improved ferroelectric properties through the use of multiple MOCVD and annealing processes.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

In this invention, a metal organic chemical vapor deposition (MOCVD) and annealing processes is disclosed, which results in high quality, specifically oriented ferroelectric thin films having low surface roughness. Ferroelectric materials which are suitable for use in the method of the invention include $Pb_5Ge_3O_{11}$ (PGO), $SrBi_2Ta_2O_9$ (SBT), $Bi_4Ti_3O_{12}$ (BTO) and $PbZr_xTi_{1-x}O_3$ (PZT).

The method of the invention provides a technique to deposit ferroelectric thin films having a preferred orientation, which results in improved surface smoothness, better surface morphology and which maintains desirable properties of an oriented ferroelectric thin film. Extremely high c-axis oriented PGO thin films demonstrate excellent ferroelectric properties, however, the surface of the PGO thin films exhibits a rough character, which creates imperfections in overlaying layers and results in inconsistent conductivity. In order to solve this problem, a low temperature MOCVD step and a high temperature annealing step are used, which results in high quality specifically oriented ferroelectric thin films having relatively smooth surfaces.

An oxide MOCVD reactor is used for the growth of c-axis oriented PGO thin films. A precursor solution of $[Pb(thd)_2]$ and $[Ge(ETO)_4]$, in a molar ratio of 5:3, is dissolved in a mixed solvent of butyl ether or tetrahydrofuran, isopropanol and tetraglyme, in a molar ratio of 8:2:1. The precursor solutions has a concentration of 0.1 mole-per-liter (M/L) of PGO. The solution is injected into a vaporizer at a temperature of between about 140° C. to 200° C., by a pump at a rate of between about 0.1 ml/min to 0.2 ml/min to form the precursor gases. The temperature of the growth line is between about 165° C. to 245° C. The deposition temperatures and pressure are between about 300° C. and 450° C. and 5 torr to 10 torr, respectively. An argon shroud gas has a flow of between about 1000 sccm to 6000 sccm, and an oxygen partial pressure of between about 20% to 50%. Deposition times of between 30 to 120 minutes are used for growth of PGO thin films on an Ir electrode. As used herein, "low temperature" is defined as a temperature <500° C., as PGO thin films are nearly amorphous at such temperatures. As the temperature rises above 500° C., and particularly above 510° C., the thin films become crystalline.

After PGO film deposition, high temperature annealing processes are used to further promote fine grain growth of the PGO thin films, at temperatures between about 500° C. to 560° C., for between about 30 minutes to 120 minutes. The processes are repeated to form multiple layers of high quality PGO thin films.

Figure 1:
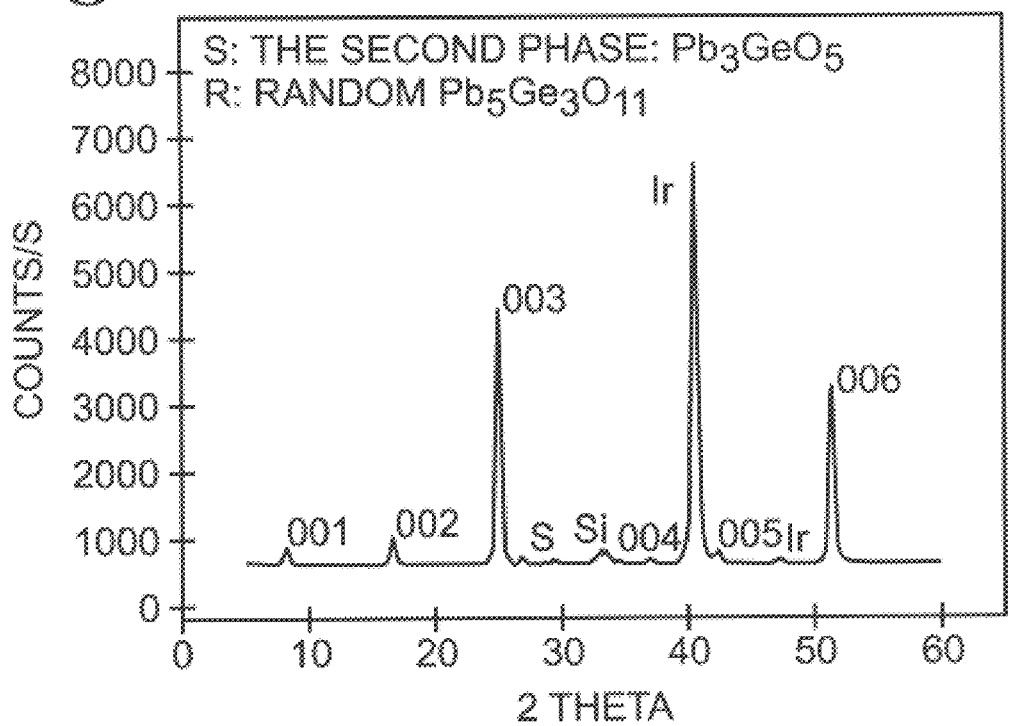
FIG. 1 depicts X-ray patterns of PGO thin films on Ir electrodes made by the MOCVD and annealing process of the method of the invention.
Figure 2:
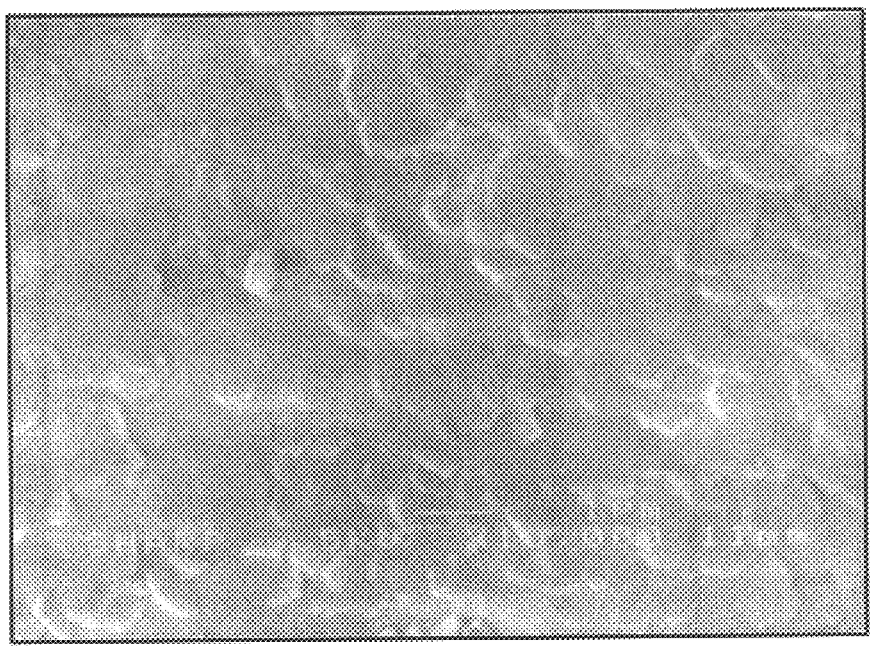
FIG. 2 depicts the microstructures of PGO thin films on Ir electrodes made by the method of the invention.

FIG. 1 depicts the X-ray pattern of c-axis oriented PGO thin films made by the low temperature MOCVD and high temperature annealing steps of the method of the invention. The PGO thin film has very high c-axis orientation of $Pb_5Ge_3O_{11}$, and very little of the second phase $Pb_3GeO_5$. FIG. 2 depicts the microstructure of a c-axis oriented PGO thin films formed by the MOCVD and annealing steps of the method of the invention. The average grain size of the PGO film is about 0.8 μm. The existence of the layered structure confirms that the c-axis oriented PGO thin films grew layer-by-layer along the c-axis direction. The layered structure is depicted by the scale-like appearance in the microphotograph of FIG. 2, which has been partially enhanced on the right side thereof to better show the layering. The thickness of PGO thin film is measured at about 300 nm.

Figure 3:
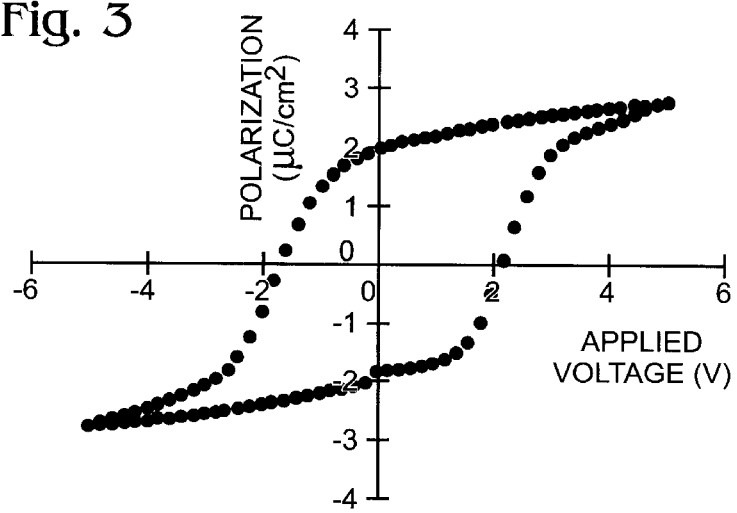
FIG. 3 depicts the hysteresis loop of PGO thin film on Ir electrodes made by the method of the invention.
Figure 4:
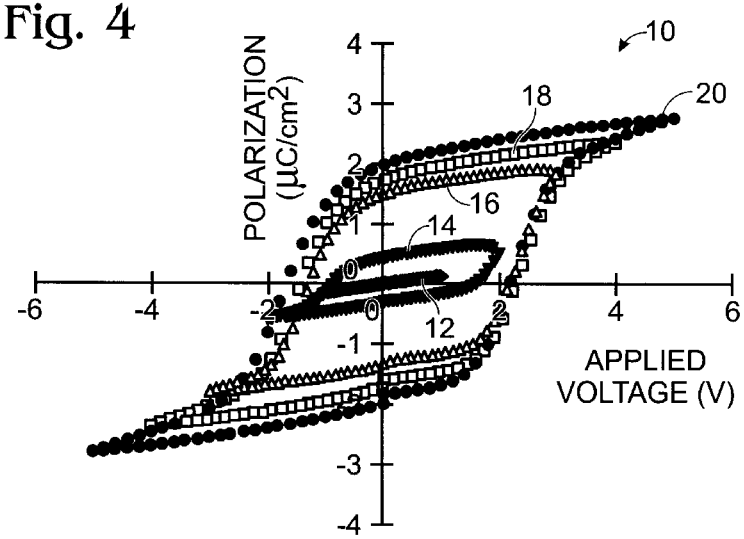
FIG. 4 depicts the hysteresis loops of PGO thin film on Ir electrodes made by the method of the invention at various applied voltages.
Figure 4:
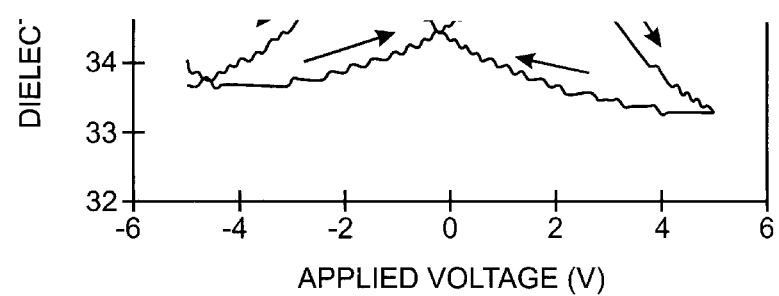

PGO thin films made by the method of the invention exhibit very good ferroelectric and electrical properties. FIG. 3 depicts the hysteresis loop of the PGO thin film, which is square, symmetrical and well saturated, at an applied voltage of 5 volts, wherein voltage is on the x-axis and polarization ($\mu C/cm^2$) is on the y-axis. The 2Pr of 3.98 $\mu C/cm^2$, and the 2Ec of 128 KV/cm are obtained for the PGO film. FIG. 4 depicts the hysteresis loops of the PGO thin films, generally at 10. Traces are shown for one volt, 12; two volts, 14; three volts, 16; four volts, 18; and five volts, 20. The hysteresis loops of the PGO thin film are nearly saturated from 3 volts.

Figure 5:
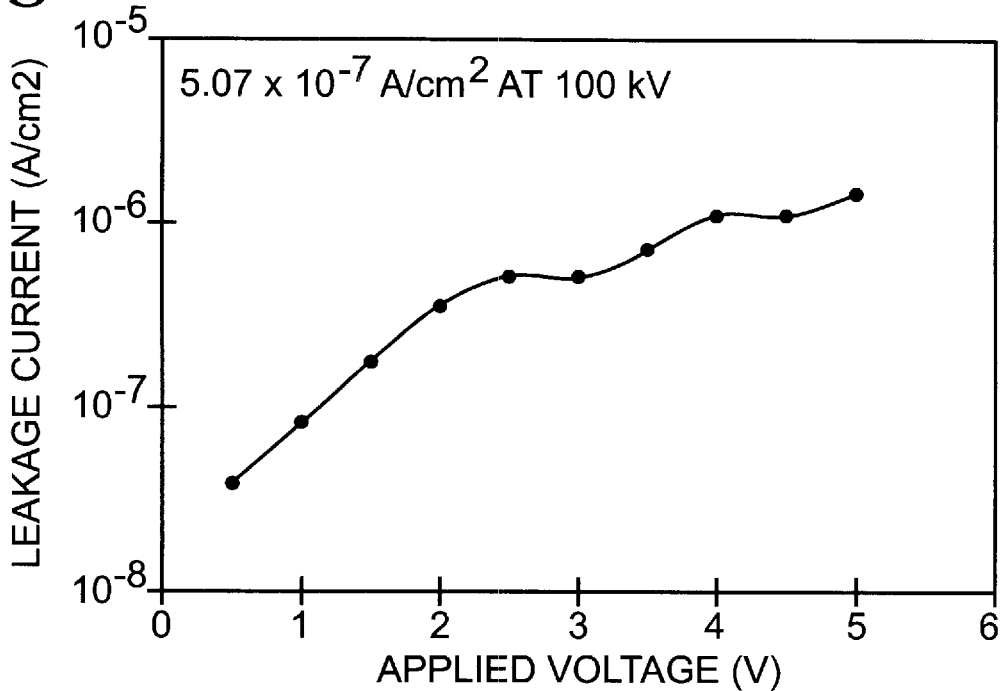
FIG. 5 depicts the leakage current of PGO thin film on Ir electrodes made by the method of the invention.

A low leakage current density is an important consideration for memory device applications. FIG. 5 depicts the I-V curve of a 300 nm thick MOCVD PGO thin film formed according to the method of the invention. Excellent I-V characteristics are present. The leakage current density of the $Pb_5Ge_3O_{11}$ thin films increases with increasing applied voltage, and is about $5.07 \times 10^{-7}$ A/cm2 at 100 KV/cm.

Figure 6:
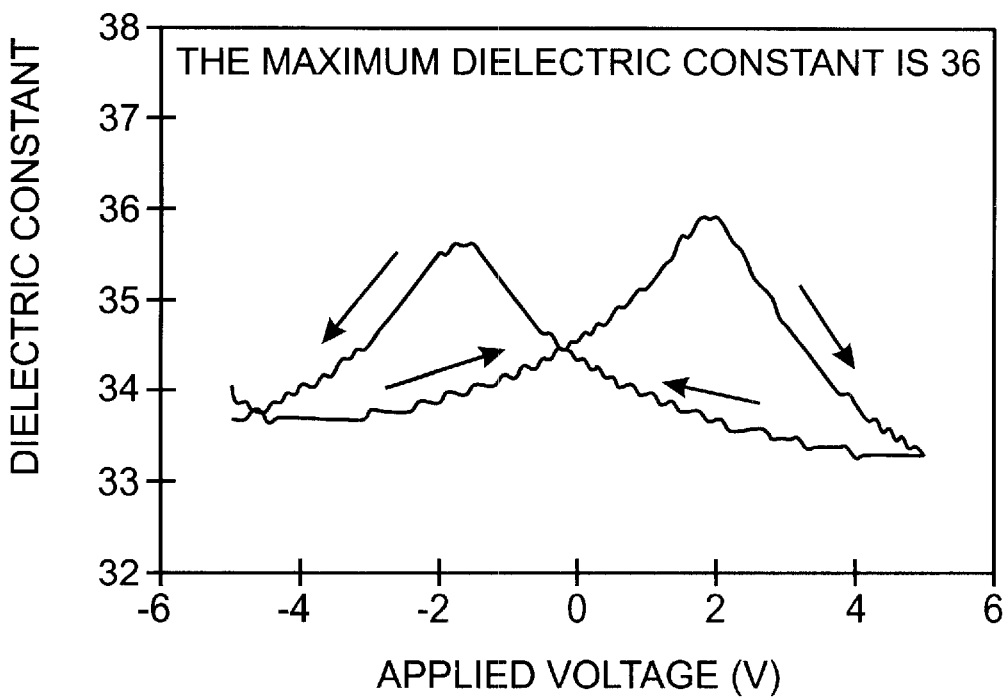
FIG. 6 depicts the dielectric constants of PGO thin film on Ir electrodes made by the method of the invention.

The dielectric constant is also another important consideration for a memory device, especially for one transistor memory applications. The dielectric constant of $Pb_5Ge_3O_{11}$ thin films exhibits similar behavior to most ferroelectric materials, i.e., the dielectric constant changes with applied voltage. The maximum dielectric constant of the $Pb_5Ge_3O_{11}$ thin films is about 36, as shown is FIG. 6.

In summary, a process of low temperature MOCVD of ferroelectric material and high temperature annealing produces a c-axis oriented PGO thin film having reducing the surface roughness. The method of the invention produces high quality PGO thin films on Ir electrodes having a 2Pr of 3.98 $\mu C/cm^2$ and a 2Ec of 128 kV/cm.

Thus, a method for low temperature ferroelectric MOCVD and annealing for c-axis oriented ferroelectric thin films has been disclosed. It will be appreciated that further variations and modifications thereof may be made within the scope of the invention as defined in the appended claims.

We claim:

1. A method of fabricating a c-axis ferroelectric thin film comprising:
   preparing a substrate;
   depositing a layer of amorphous ferroelectric material by metal organic chemical vapor deposition, including using a precursor solution having a ferroelectric material concentration of about 0.1 M/L at a vaporizer temperature of between about 140° C. to 200° C.; and
   annealing the substrate and the ferroelectric material at a temperature between about 500° C. to 560° C. for between about 30 minutes to 120 minutes to produce an amorphous ferroelectric thin film having a grain size of about 0.8 μm.

2. The method of claim 1 wherein said depositing includes selecting a ferroelectric material from the group of materials consisting of $Pb_5Ge_3O_{11}$ (PGO), $SrBi_2Ta_2O_9$ (SBT), $Bi_4Ti_3O_{12}$ (BTO) and $PbZr_xTi_{1-x}O_3$ (PZT).

3. The method of claim 1 wherein said depositing includes preparing a precursor solution of $[Pb(thd)_2]$ and $[Ge(ETO)_4]$, in a molar ratio of 5:3, dissolved in a mixed solvent including a solvent taken from the group of solvents consisting of butyl ether and tetrahydrofuran, isopropanol and tetraglyme, in a molar ratio of 8:2:1.

4. The method of claim 1 wherein said depositing includes providing the precursor solution at a pump rate of between about 0.1 ml/min and 0.2 ml/min.

5. The method of claim 1 wherein said depositing includes providing a growth line temperature in the MOCVD chamber of between about 165° C. and 245° C.

6. The method of claim 1 wherein said depositing includes depositing the ferroelectric material at a deposition temperature of between about 300° C. and 450° C.

7. The method of claim 1 wherein said depositing includes depositing the ferroelectric material at a deposition pressure of between about 5 torr. to 10 torr.

8. The method of claim 1 wherein said depositing includes providing a shroud gas of argon at a flow of between about 1000 sccm to 6000 sccm and an oxygen partial pressure of between about 20% to 50%.

9. The method of claim 1 wherein said depositing includes depositing the ferroelectric material over a time period of between about 30 minutes and 120 minutes.

10. A method of fabricating a c-axis ferroelectric thin film comprising:
    preparing a substrate;
    depositing a layer of amorphous ferroelectric material in a MOCVD chamber at a deposition temperature of between about 300° C. and 450° C. from the group of materials consisting of $Pb_5Ge_3O_{11}$ (PGO), $SrBi_2Ta_2O_9$ (SBT), $Bi_4Ti_3O_{12}$ (BTO) and $PbZr_xTi_{1-x}O_3$ (PZT) by metal organic chemical vapor deposition, including using a precursor solution having a ferroelectric material concentration of about 0.1 M/L at a vaporizer temperature of between about 140° C. to 200° C. to produce an amorphous ferroelectric thin film having a grain size of about 0.8 μm; and
    annealing the substrate and the ferroelectric material at a temperature between about 500° C. to 560° C. for between about 30 minutes to 120 minutes.

11. The method of claim 10 wherein said depositing includes preparing a precursor solution of $[Pb(thd)_2]$ and $[Ge(ETO)_4]$, in a molar ratio of 5:3, dissolved in a mixed solvent including a solvent taken from the group of solvents consisting of butyl ether and tetrahydrofuran, isopropanol and tetraglyme, in a molar ratio of 8:2:1, and providing the precursor solution at a pump rate of between about 0.1 ml/min and 0.2 ml/min.

12. The method of claim 10 wherein said depositing includes providing a growth line temperature in the MOCVD chamber of between about 165° C. and 245° C.

13. The method of claim 10 wherein said depositing includes depositing the ferroelectric material at a deposition pressure of between about 5 torr. to 10 torr.

14. The method of claim 10 wherein said depositing includes providing a shroud gas of argon at a flow of between about 1000 sccm to 6000 sccm and an oxygen partial pressure of between about 20% to 50%.

15. The method of claim 10 wherein said depositing includes depositing the ferroelectric material over a time period of between about 30 minutes and 120 minutes.

16. A method of fabricating a c-axis ferroelectric thin film comprising:

preparing a substrate;

depositing a layer of amorphous ferroelectric material by metal organic chemical vapor deposition, including preparing a precursor solution of [Pb(thd)$_2$] and [Ge(ETO)$_4$], in a molar ratio of 5:3, dissolved in a mixed solvent including a solvent taken from the group of solvents consisting of butyl ether and tetrahydrofuran, isopropanol and tetraglyme, in a molar ratio of 8:2:1, and using a precursor solution having a ferroelectric material concentration of about 0.1 M/L at a vaporizer temperature of between about 140° C. to 200° C. to produce an amorphous ferroelectric thin film having a grain size of about 0.8 µm; and annealing the substrate and the ferroelectric material at a temperature between about 500° C. to 560° C. for between about 30 minutes to 120 minutes.

17. The method of claim 16 wherein said depositing includes providing the precursor solution at a pump rate of between about 0.1 ml/min and 0.2 ml/min.

18. The method of claim 16 wherein said depositing includes providing a growth line temperature in the MOCVD chamber of between about 165° C. and 245° C.

19. The method of claim 16 wherein said depositing includes depositing the ferroelectric material at a deposition temperature of between about 300° C. and 450° C.

20. The method of claim 16 wherein said depositing includes depositing the ferroelectric material at a deposition pressure of between about 5 torr. to 10 torr.

21. The method of claim 16 wherein said depositing includes providing a shroud gas of argon at a flow of between about 1000 sccm to 6000 sccm and an oxygen partial pressure of between about 20% to 50%.

22. The method of claim 16 wherein said depositing includes depositing the ferroelectric material over a time period of between about 30 minutes and 120 minutes.

* * * * *